(12) United States Patent
Cimaz et al.

(10) Patent No.: US 12,470,225 B2
(45) Date of Patent: Nov. 11, 2025

(54) FRACTIONAL FREQUENCY SYNTHESIZER UTILIZING MULTI-PHASE DIVIDER CIRCUITRY

(71) Applicant: STMicroelectronics International N.V., Geneva (CH)

(72) Inventors: Lionel Cimaz, Pleumeleuc (FR); Denis Michael Flores Pazos, Grenoble (FR)

(73) Assignee: STMicroelectronics International N.V., Geneva (CH)

(*) Notice: Subject to any disclaimer, the term of this patent is extended or adjusted under 35 U.S.C. 154(b) by 96 days.

(21) Appl. No.: 18/526,670

(22) Filed: Dec. 1, 2023

(65) Prior Publication Data

US 2025/0183901 A1    Jun. 5, 2025

(51) Int. Cl.
*H03L 7/197* (2006.01)
*H03L 7/093* (2006.01)

(52) U.S. Cl.
CPC ............ *H03L 7/1976* (2013.01); *H03L 7/093* (2013.01)

(58) Field of Classification Search
CPC ... H03L 7/0991; H03L 2207/50; H03L 7/091; H03L 7/085; H03L 7/16; H03L 7/0992; H03L 7/0993; H03L 7/0994; H03L 7/099; H03L 7/18; H03L 7/1803; H03L 7/1806; H03L 7/181; H03L 7/183; H03L 7/197; H03L 7/185; H03L 7/187; H03L 7/189; H03L 7/191; H03L 7/193; H03L 7/195; H03L 7/1972; H03L 7/1974; H03L 7/1976; H03L 7/199; H03L 7/1978
See application file for complete search history.

(56) References Cited

U.S. PATENT DOCUMENTS

| | | | |
|---|---|---|---|
| 5,448,193 A * | 9/1995 | Baumert | G06F 1/08 327/236 |
| 5,970,110 A | 10/1999 | Li | |
| 7,777,534 B2 * | 8/2010 | Kuan | H03K 23/68 327/407 |
| 8,493,107 B2 * | 7/2013 | Staszewski | H03K 5/131 327/185 |
| 10,784,844 B2 * | 9/2020 | Nakajima | H03K 3/037 |
| 2014/0185736 A1 | 7/2014 | Chandrashekar et al. | |
| 2017/0093412 A1 | 3/2017 | Van Brunt et al. | |
| 2019/0074842 A1 | 3/2019 | Sun | |
| 2023/0126891 A1 | 4/2023 | Geetla et al. | |

* cited by examiner

Primary Examiner — Diana J. Cheng
(74) Attorney, Agent, or Firm — Alston & Bird LLP

(57) ABSTRACT

A fractional frequency synthesizer, a fractional PLL, and a method for generating a fractional frequency signal based on a reference signal are provided. An example fractional frequency synthesizer includes a multi-phase clock generator configured to generate a clock vector comprising a plurality of clock signals, each oscillating according to a fractional frequency in relation to the reference frequency and each clock signal offset by a phase offset. The fractional frequency synthesizer includes multi-phase divider circuitry configured to select a clock signal from the clock vector to generate a fractional frequency feedback signal. An accumulator configured to increment a count and a rollover detector configured to determine a rollover value associated with a rollover event on the accumulator are further included. A clock signal is selected based on the rollover value and the fractional frequency feedback signal is generated based at least in part on the selected clock signal.

20 Claims, 11 Drawing Sheets

FRACTIONAL FREQUENCY SYNTHESIZER UTILIZING MULTI-PHASE DIVIDER CIRCUITRY

TECHNOLOGICAL FIELD

Embodiments of the present disclosure relate generally to fractional frequency synthesizers and more particularly to a fractional phase-locked loop (PLL) based on a fractional frequency synthesizer.

BACKGROUND

Many modern electronic devices utilize phase-locked loops to perform various operations of the electronic device. A PLL is a control system that generates an output signal with a phase related to the phase of an input signal. A PLL may be used to generate a signal with a determined frequency, stabilize a signal, modulate or demodulate a signal, filter or recover a signal from a noisy communication channel, multiply or divide a frequency, and so on. Fractional PLLs are a type of PLL that may be used to generate frequencies at non-integer intervals based on a reference frequency. Fractional PLLs enable the generation of output signals with smaller step sizes (e.g., higher resolutions).

Applicant has identified many technical challenges and difficulties associated with generating fractional frequency signals based on a reference signal. Through applied effort, ingenuity, and innovation, Applicant has solved problems related to the generation of fractional frequency signals by developing solutions embodied in the present disclosure, which are described in detail below.

BRIEF SUMMARY

Various embodiments are directed to an example fractional frequency synthesizer, a fractional PLL, and a method for generating a fractional frequency signal based on a reference signal. In some embodiments, a fractional frequency synthesizer, may comprise a multi-phase clock generator configured to generate a clock vector based on a reference signal having a reference frequency, wherein the clock vector comprises a plurality of clock signals each clock signal oscillating according to a fractional frequency in relation to the reference frequency, and wherein each clock signal is offset by a phase offset. The fractional frequency synthesizer may further comprise multi-phase divider circuitry electrically connected to the multi-phase clock generator and configured to receive the clock vector and select a selected clock signal from the plurality of clock signals to generate a fractional frequency feedback signal. The multi-phase divider circuitry comprising an accumulator configured to increment a count according to the fractional frequency and a rollover detector configured to determine a rollover value associated with a rollover event of the count on the accumulator. In some embodiments, the selected clock signal is selected based on the rollover value and the fractional frequency feedback signal is generated based at least in part on the selected clock signal.

In some embodiments, the multi-phase clock generator comprises a voltage-controlled ring oscillator.

In some embodiments, the voltage-controlled ring oscillator comprises a delay line comprising a plurality of delay elements, wherein the plurality of clock signals comprising the clock vector are transmitted from a plurality of contact points along the delay line.

In some embodiments, the accumulator comprises a counter comprising a counter bit quantity number of bits, wherein the counter is configured to increment the count by a step value.

In some embodiments, the fractional frequency of the plurality of clock signals is determined based at least in part on the counter bit quantity and the step value.

In some embodiments, the rollover value represents the count after the rollover event of the accumulator.

In some embodiments, the selected clock signal is determined based at least in part on a comparison of the rollover value to the step value.

In some embodiments, the comparison of the rollover value to the step value is determined using a division look-up table.

In some embodiments, a frequency offset is determined between a clock edge of the selected clock signal and an ideal clock edge of the fractional frequency signal, wherein a second selected clock signal corresponding with a next accumulator rollover event is determined based at least in part on the frequency offset.

In some embodiments, the selected clock signal is determined before the rollover event of the accumulator.

In some embodiments, the phase offset between each subsequent clock signal comprising the plurality of clock signals of the clock vector are equal.

In some embodiments, the clock vector comprises at least four clock signals.

A method for generating a fractional frequency feedback signal is further provided. In some embodiments, the method comprises receiving, from a multi-phase clock generator at multi-phase divider circuitry, a clock vector comprising a plurality of clock signals each clock signal oscillating according to a fractional frequency based at least in part on a reference frequency of a reference signal, and each clock signal offset by a phase offset. The method further comprising detecting, at the multi-phase divider circuitry, a rollover event of an accumulator configured to increment a count according to the fractional frequency. The method further comprising determining a rollover value corresponding to the count at the rollover event. The method further comprising selecting a selected clock signal from the plurality of clock signals based on the rollover value, and generating the fractional frequency feedback signal based at least in part on the selected clock signal.

In some embodiments, the accumulator comprises a counter comprising a counter bit quantity number of bits, wherein the counter is configured to increment the count by a step value based at least in part on the reference frequency.

In some embodiments, the fractional frequency of the plurality of clock signals is determined based at least in part on the counter bit quantity and the step value.

In some embodiments, the rollover value represents the count after the rollover event of the accumulator.

In some embodiments, the method further comprises determining a relation between the rollover value and the step value and selecting the selected clock signal based at least in part on the relation.

In some embodiments, the method further comprises determining a phase difference between a clock edge of the selected clock signal and an ideal clock edge of the reference signal and determining a second selected clock signal corresponding with a next accumulator rollover event based at least in part on the frequency difference.

In some embodiments, the phase offset between each subsequent clock signal comprising the plurality of clock signals of the clock vector are equal.

A fractional phase-locked loop is further provided. In some embodiments, the fractional phase-locked loop comprises a phase detector module configured to generate a difference signal corresponding to a difference between a phase of a reference signal and a fractional frequency feedback signal, a loop filter configured to generate a filtered difference signal based at least in part on the difference signal, and a fractional frequency synthesizer configured to generate the fractional frequency feedback signal. The fractional frequency synthesizer may comprise a multi-phase clock generator configured to generate a clock vector based on the filtered difference signal, the clock vector comprising a plurality of clock signals each clock signal oscillating according to a fractional frequency based at least in part on a reference frequency of the reference signal, and each clock signal offset by a phase offset. The fractional frequency synthesizer may further comprise multi-phase divider circuitry electrically connected to the multi-phase clock generator and configured to receive the clock vector and select a selected clock signal from the clock vector to generate the fractional frequency feedback signal. The multi-phase divider circuitry comprising an accumulator configured to increment a count according to the fractional frequency and a rollover detector configured to detect a rollover value associated with a rollover event of the accumulator, wherein the selected clock signal is selected based on the rollover value, and wherein the fractional frequency feedback signal is generated based at least in part on the selected clock signal.

BRIEF DESCRIPTION OF THE DRAWINGS

Reference will now be made to the accompanying drawings. The components illustrated in the figures may or may not be present in certain embodiments described herein. Some embodiments may include fewer (or more) components than those shown in the figures in accordance with an example embodiment of the present disclosure.

DETAILED DESCRIPTION

Figure 1:
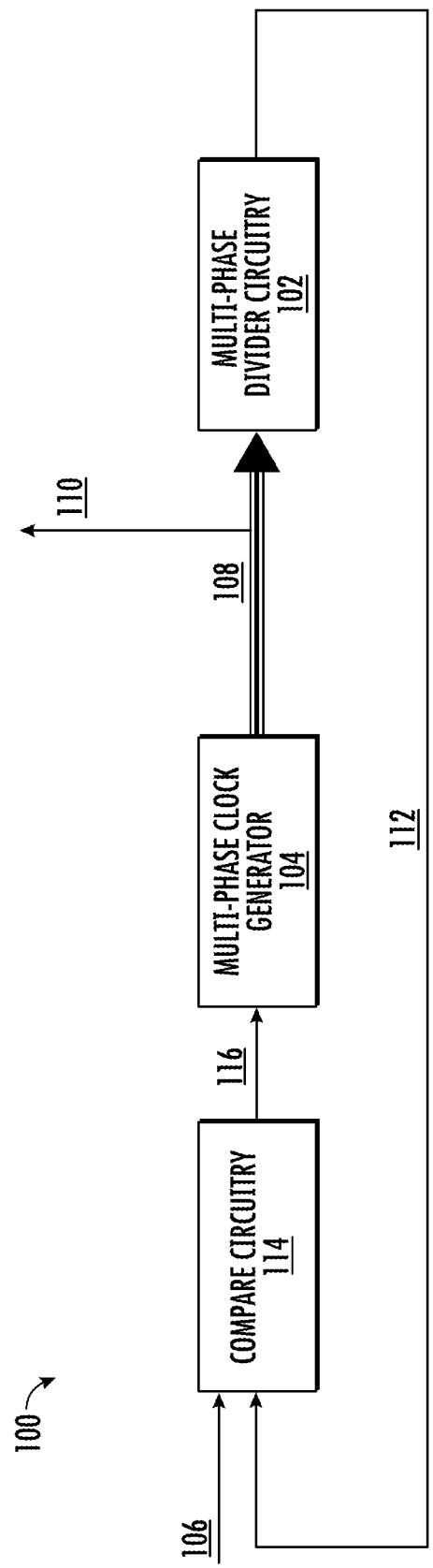
FIG. 1 illustrates a block diagram of an example fractional frequency synthesizer utilizing a clock vector and a multi-phase divider block in accordance with an example embodiment of the present disclosure.

Example embodiments will be described more fully hereinafter with reference to the accompanying drawings, in which some, but not all embodiments of the inventions of the disclosure are shown. Indeed, embodiments of the disclosure may be embodied in many different forms and should not be construed as limited to the embodiments set forth herein; rather, these embodiments are provided so that this disclosure will satisfy applicable legal requirements. Like numbers refer to like elements throughout.

Various example embodiments address technical problems associated with generating an accurate fractional frequency signal based on a reference signal. As understood by those of skill in the field to which the present disclosure pertains, there are numerous example scenarios in which a fractional frequency signal may need to be generated based on a provided reference signal.

For example, many modern electronic devices utilize phase-locked loops (PLLs) to perform various operations of the electronic device. A PLL is a control system that generates an output signal with a phase related to the phase of an input signal. A PLL may be used to generate a signal with a determined frequency, stabilize a signal, modulate or demodulate a signal, filter or recover a signal from a noisy communication channel, and so on. PLLs may take the form of integer PLLs or fractional PLLs.

In general, an integer PLL is a PLL that generates output signals at integer multiples of the input frequency. For example, if the frequency of a reference signal provided to a PLL is $F_{ref}$ and the output frequency of the PLL is $F_{out}$, then the ratio of the output frequency to the reference signal ($F_{out}/F_{ref}$) is an integer. On the other hand, fractional PLLs can be used to generate output frequencies at non-integer intervals based on a reference frequency (e.g., $F_{out}/F_{ref}$ is not an integer). Fractional PLLs enable the generation of output signals with smaller step sizes (e.g., higher resolutions). Fractional PLLs may generate output signals to be used as clock signals for system logic, providing timing for data converters and radio frequency systems, and other applications.

Some previous examples have used a form of alternating division factors to obtain fractional frequency signal outputs. For example, by alternating by a divide of 10 and 11, an overall fractional frequency around 10.5 may be obtained. By alternating division factors, an alternating division fractional PLL can effectively obtain fractional output frequencies. However, alternating factors in an alternating division fractional PLL may have drawbacks. By alternating factors in an alternating division fractional PLL, the frequency of the output signal may experience jitter due to slight variations in the output signal at each clock edge. Jitter is the variation of a clock edge in time when compared with an ideal clock edge.

In a perfect clock oscillating at a frequency $F_{ideal}$, the clock would be asserted precisely at every time $t_{edge}=(1/$ $F_{ideal}$)*n, n being integer. However, a real signal may not be perfect, especially when generating a fractional frequency signal. As such, there will be an error in the precision of the clock edge assertion. The error may be attributable to noise, alternating divisional factors, or other variables. In reality, the real edge time will be $t_{real}=(1/F_{ideal})*n+\Delta(n)$ where $\Delta(n)$ is a time error for each cycle. The $\Delta(n)$, or time error in the clock edge assertion, is the jitter. As the jitter is a signal with a measurable value over time, certain parameters of the jitter may be calculated, such as peak-to-peak variation (p2p) For example, the p2p variation of jitter may be calculated as:

$$p2p(\Delta(n)) = \max(\Delta(n)) - \min(\Delta(n))$$

Similarly, the root mean square (RMS) of jitter may be calculated as:

$$\mathrm{rms}(\Delta(n)) = \sqrt{\frac{1}{n} \cdot \sum_0^{N-1} \Delta(n)^2}$$

In general, a PLL is a looped system utilizing a phase detector module to drive a voltage-controlled oscillator (VCO) configured to produce an output signal (e.g., fractional frequency signal) having the desired frequency. Without any noise, the clock edges of the reference signal, provided to the PLL, and the clock edges of the fractional frequency feedback signal, generated by the PLL, will be perfectly aligned. Thus, the phase detector module will not adjust the voltage provided to the VCO. The frequency of VCO will be constant and all the edges of the output signal will be perfectly aligned with the ideal clock output. In such an instance, the jitter of the fractional frequency signal is 0.

However, in practice, the fractional frequency feedback signal is not perfectly aligned with the edges of the reference signal. In such an instance, the phase detector module determines an output voltage based on the edge timing difference (e.g., phase difference) between the fractional frequency feedback signal and the reference signal. The output voltage will be transmitted to the VCO, causing the VCO to raise or lower the frequency of the fractional frequency signal. The changes in frequency of the fractional frequency signal (even when reduced by the loop filter) mean that edge timings of the fractional frequency signal will vary from cycle to cycle, resulting in jitter.

The issue of jitter may be particularly problematic in an alternating division fractional PLL. Thus, there is a need for a fractional PLL configured to produce a fractional frequency signal based on a reference signal while minimizing the amount of jitter.

The various example embodiments of the present disclosure provide a fractional frequency synthesizer utilizing a multi-phase clock vector comprising a plurality of clock signals and multi-phase divider circuitry configured to determine a selected clock signal of the multi-phase clock vector based on a rollover value of a reference accumulator count to produce a fractional output signal based on a reference frequency of the reference signal received by the fractional frequency synthesizer. The multi-phase clock vector and multi-phase divider circuitry enable the generation of a fractional frequency signal based on the reference signal having a fractional frequency in relation to the reference signal and with reduced peak-to-peak and RMS jitter.

In some embodiments, a voltage-controlled ring oscillator may be utilized to generate a multi-phase clock vector based on the reference signal. The multi-phase clock vector may include a plurality of clock signals each having a frequency equal in frequency to the fractional frequency signal. However, the voltage-controlled ring oscillator may be configured to generate the plurality of clock signals wherein each clock signal of the multi-phase clock vector is offset by a phase offset from adjacent clock signals. In some embodiments, the phase offset between each subsequent clock signal of the plurality of clock signals may be equal.

Multi-phase divider circuitry may be further provided. In general, the multi-phase divider circuitry may be configured with an accumulator configured to increment a count comprising a counter bit quantity number of bits by a step value. The counter bit quantity and step value may in part determine the fractional frequency of the fractional frequency signal generated by the multi-phase clock generator. In addition, the multi-phase divider circuitry may be configured to detect a rollover event and a rollover value associated with the rollover event. The rollover value may be received by a phase computation module, the phase computation module configured to determine a selected clock signal from the plurality of clock signals to closely align with a clock event of the desired fractional frequency signal.

As a result of the herein described example embodiments and in some examples, the jitter of a fractional frequency signal generated by a fractional frequency synthesizer may be greatly reduced. In addition, utilizing the concepts described in the present disclosure, a high accuracy fractional frequency signal may be generated using cost and area efficient components.

Referring now to FIG. 1, a block diagram of an example fractional frequency synthesizer 100 is provided. As depicted in FIG. 1, the example fractional frequency synthesizer 100 includes multi-phase divider circuitry 102 configured to receive a multi-phase clock vector 108 comprising a plurality of clock signals generated by a multi-phase clock generator 104. The multi-phase clock generator 104 is configured to generate the multi-phase clock vector 108 based at least in part on a difference signal 116 corresponding to a phase and/or frequency difference between a fractional frequency feedback signal 112 generated by the multi-phase divider circuitry 102 and a reference signal 106. The multi-phase divider circuitry 102 is further configured to determine a selected clock signal from the multi-phase clock vector 108 such that a fractional frequency signal 110 exhibiting a fractional frequency corresponding to the reference frequency of the reference signal 106 is generated.

As depicted in FIG. 1, the example fractional frequency synthesizer 100 includes a multi-phase clock generator 104. A multi-phase clock generator 104 is any circuitry including hardware and/or software configured to receive a difference signal 116 corresponding to a phase and/or frequency difference between a reference signal 106 and a fractional frequency feedback signal 112 and generate a multi-phase clock vector 108 comprising a plurality of clock signals each clock signal of the plurality of clock signals oscillating according to a fractional frequency of the reference frequency but each clock signal at a phase offset from the other clock signals.

In some embodiments, the phase offset of each of the subsequent signals comprising the multi-phase clock vector 108 generated by the multi-phase clock generator 104 may be equal. For example, a second clock signal in the multi-phase clock vector 108 may be offset from a first clock signal by $$\frac{\pi}{3}$$

radians, a third clock signal in the multi-phase clock vector 108 may be offset from the first clock signal by $$\frac{2\pi}{3}$$

radians, a fourth clock signal in the multi-phase clock vector 108 may be offset from the first clock signal by $\pi$ radians, a fifth clock signal in the multi-phase clock vector 108 may be offset from the first clock signal by $$\frac{4\pi}{3}$$

radians, and so on.

Further, in some embodiments, the clock signals comprising the multi-phase clock vector 108 generated by the multi-phase clock generator 104 may be equally spaced across the period of the first clock signal. For example, in an instance in which the first clock signal oscillates with a period, T, and the multi-phase clock generator 104 is configured to generated a multi-phase clock vector 108 including ten clock signals, the multi-phase clock generator 104 may be configured to generate subsequent clock signals offset by one-tenth of the first clock signal period, in other words:

$$\varphi_n = T\left(\frac{n}{\text{clock\_vector}_{size}}\right)$$

where T is the clock period of the reference signal 106, n, is the $n^{th}$ clock signal in the multi-phase clock vector 108, clock_vector$_{size}$, is the number of clock signals in the multi-phase clock vector 108, and $\varphi_n$, is the phase offset with respect to the first clock signal of the $n^{th}$ clock signal in the multi-phase clock vector 108.

Figure 2:
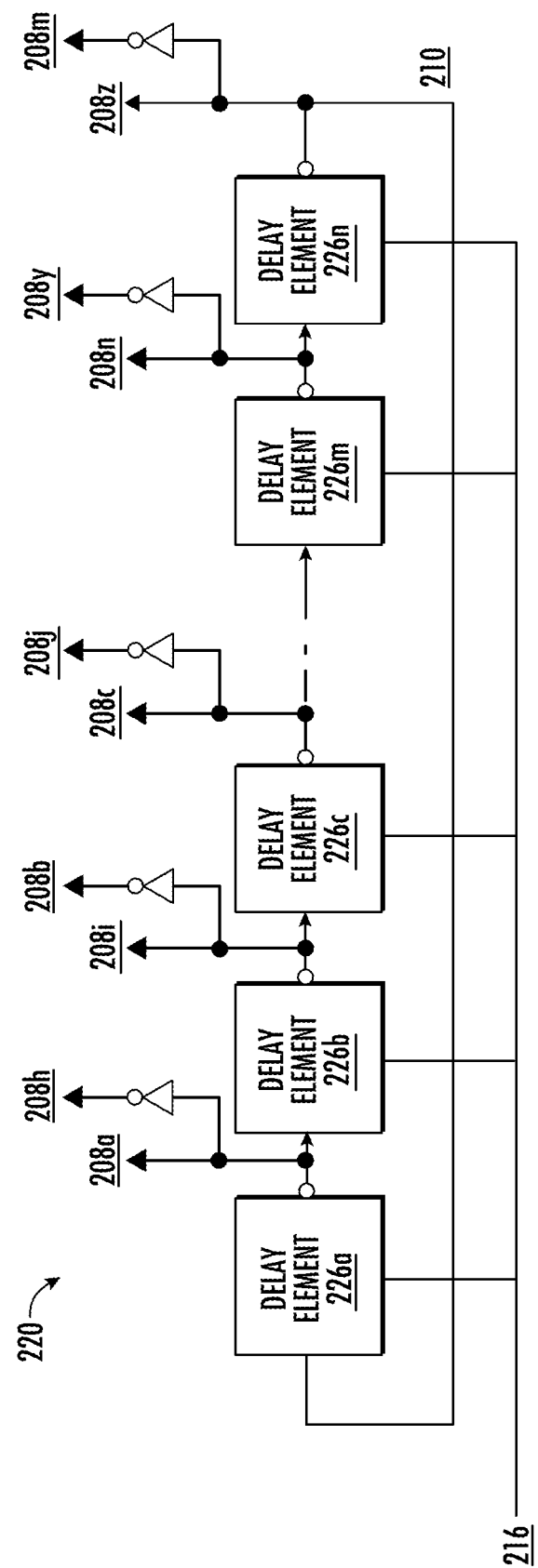
FIG. 2 illustrates a block diagram of an example embodiment of a multi-phase clock generator in accordance with an example embodiment of the present disclosure.

Referring now to FIG. 2, an example voltage-controlled ring oscillator 220 is provided. In some embodiments, a multi-phase clock generator 104 may comprise a voltage-controlled ring oscillator, for example, a voltage-controlled ring oscillator 220 as depicted in FIG. 2. As depicted in FIG. 2, the example voltage-controlled ring oscillator 220 includes a plurality of delay elements 226a-226n configured to generate a fractional frequency signal 210 based at least in part on a difference signal 216 and the feedback of the fractional frequency signal 210. As further depicted in FIG. 2, the multi-phase clock vector 208 may comprise a plurality of clock signals 208a-208z extracted from various stages of the voltage-controlled ring oscillator 220, each clock signal 208a-208z exhibiting a phase offset from the neighboring clock signal 208a-208z.

As depicted in FIG. 2, the example voltage-controlled ring oscillator 220 may comprise a plurality of delay elements 226a-226n. A delay element 226a-226n may be any electrical component configured to receive an input signal and generate an output signal with a delay corresponding to the difference signal 216. In some embodiments, a delay element 226a-226n may comprise an inverter or logical-not gate configured to output an inverted signal corresponding to the received input signal. As such, in an instance in which an odd number of delay elements 226a-226n comprise the voltage-controlled ring oscillator 220 (e.g., 3, 5, 7, 9), the fractional frequency signal 210 oscillates between a logical 1 and a logical 0. Thus, the fractional frequency signal 210 oscillates between logical 0 and logical 1 at a fractional frequency.

As further depicted in FIG. 2, the delay of each delay element 226a-226n varies in relation to the difference signal 216. For example, as the magnitude of the difference signal 216 increases, the delay of each delay element 226a-226n may be increased; and similarly, as the magnitude of the difference signal 216 decreases, the delay of each delay element 226a-226n may be decreased. Thus, the frequency of oscillation of the fractional frequency signal 210 may be adjusted based on the difference signal 216. As described herein, in an instance in which the difference signal 216 is generated by comparing the reference signal (e.g., reference signal 106) to the fractional frequency feedback signal (e.g., fractional frequency feedback signal 112), the fractional frequency signal 210 may converge to a fractional frequency of the reference signal as determined by the multi-phase divider circuitry (e.g., multi-phase divider circuitry 102).

As further depicted in FIG. 2, the voltage-controlled ring oscillator 220 is configured to output a multi-phase clock vector 208 comprising a plurality of clock signals 208a-208z. As depicted in FIG. 2, the plurality of clock signals 208a-208z may be extracted from between the various delay elements 226a-226n. Thus, the plurality of clock signals 208a-208z may each oscillate at the same frequency but each at a phase offset from an adjacent signal. In an embodiment in which the delay elements 226a-226n are equivalent and configured to receive an equivalent voltage (e.g., difference signal 216), the delay of each delay element may be equivalent. Thus, the phase offset between each subsequent clock signal of the plurality of clock signals 208a-208n is equivalent. Further, in an instance in which the delay elements 226a-226n are equivalent and configured to receive an equivalent voltage (e.g., difference signal 216), and in an instance in which an equal number of delay elements separate the extraction point of each subsequent clock signal in the plurality of clock signals 208a-208z, the plurality of clock signals 208a-208z may be equally spaced across the period of the fractional frequency signal 210.

In addition, in some embodiments, the voltage-controlled ring oscillator 220 may comprise a plurality of inverters 228a-228n, configured to invert the plurality of clock signals 208a, 208i, 208c, 208n, 208z to generate additional clock signals 208h, 208b, 208j, 208y, 208m. By inverting the clock signals 208a, 208i, 208c, 208n, 208z extracted from between the delay elements 226a-226n of the voltage-controlled ring oscillator 220, the clock vector 208 comprises equally spaced rising (or falling) edges within a clock period. By generating a clock vector 208 comprising equally space rising (or falling) edges within a clock period, connected electrical components (e.g., multi-phase divider circuitry 102) may be configured to detect only rising (or falling) clock edges, instead of being configured to detect both rising and falling edges to obtain equally spaced clock edges. Further, the number of equally spaced clocks within a clock period may be realized using less delay elements 226a-226n.

In some embodiments, the plurality of clock signals 208a-208n may be transmitted to the multi-phase divider circuitry (e.g., multi-phase divider circuitry 102) as a multi-phase clock vector (e.g., multi-phase clock vector 108).

Figure 3:
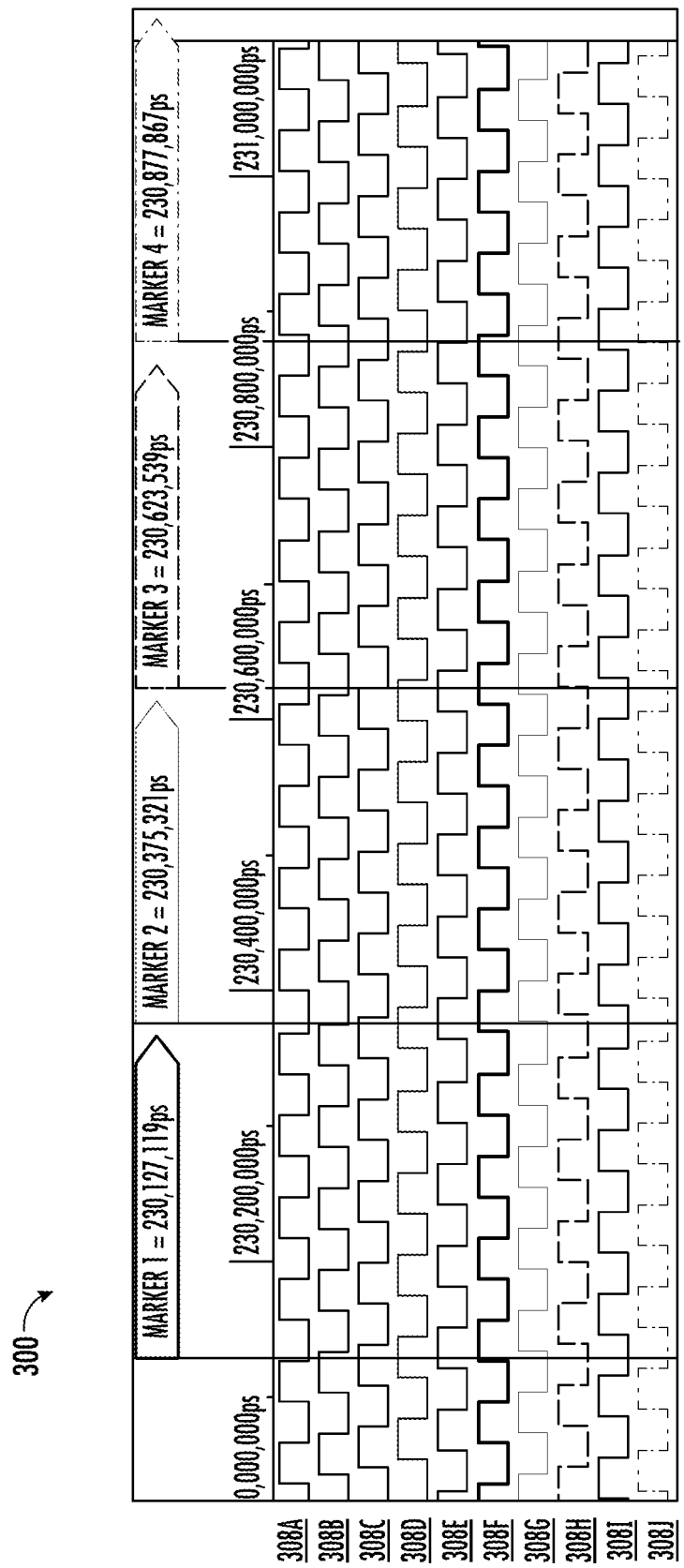
FIG. 3 illustrates an example signal diagram depicting a plurality of clock signals of a clock vector in accordance with an example embodiment of the present disclosure.

Referring now to FIG. 3, an example signal diagram 300 depicting a plurality of clock signals 308a-308j each offset by an equivalent phase offset. As further depicted in FIG. 3, the set of ten clock signals 308a-308j are equally spaced across the period of the plurality of clock signals 308a-308j. As described in relation to FIG. 1, the phase offset ($\varphi_n$) between subsequent clocks of an equally spaced multi-phase clock vector may be determined by the equation:

$$\varphi_n = T\left(\frac{n}{\text{clock\_vector}_{size}}\right)$$

where T is the period of the plurality of clock signals 308a-308j, and clock_vector$_{size}$ is the number of clock signals in the plurality of clock signals 308a-308j. Thus, as depicted in FIG. 3, the phase offset ($\varphi_n$) of each subsequent clock signal is ¹⁄₁₀ times the period (T) of the plurality of clock signals 308a-308j, or π/5 radians.

Figure 4:
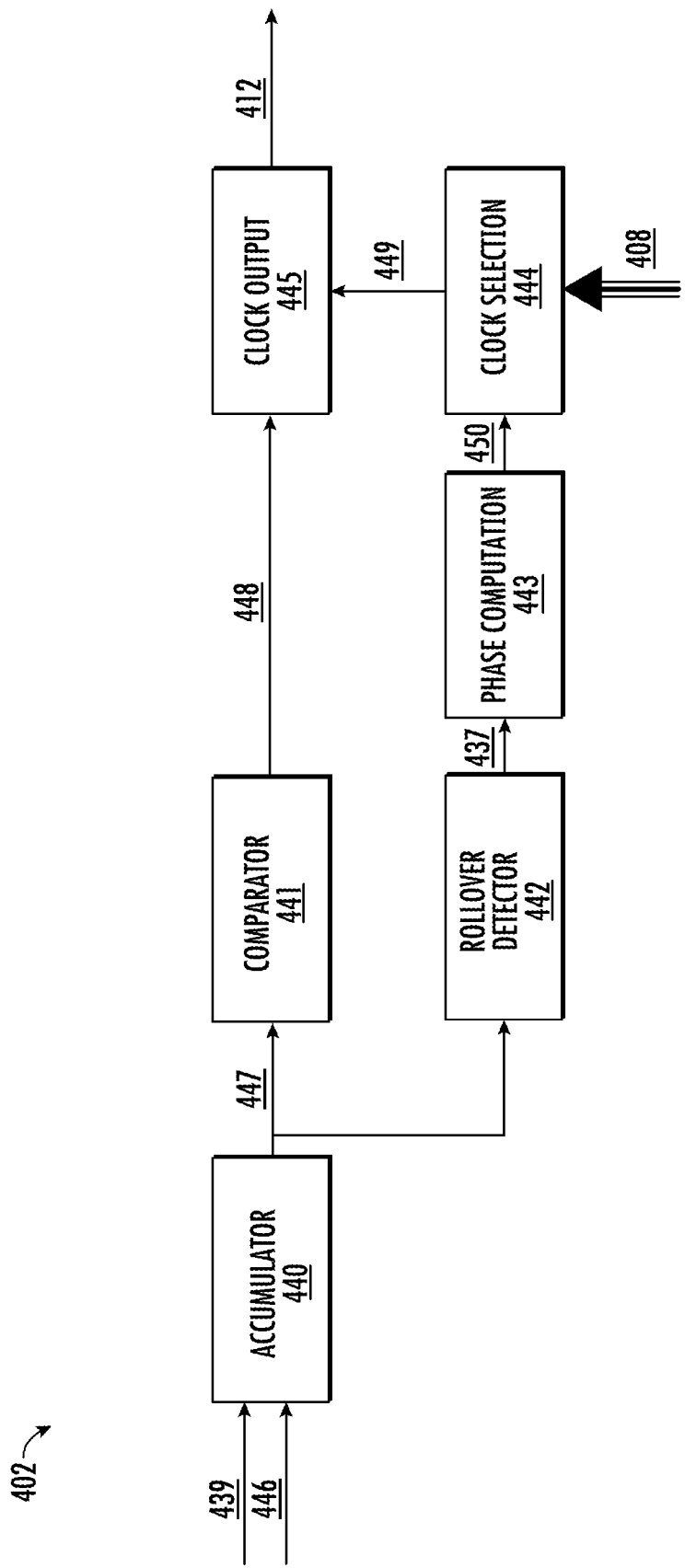
FIG. 4 illustrates an example block diagram of a multi-phase divider block in accordance with an example embodiment of the present disclosure.

Returning to FIG. 1, the example fractional frequency synthesizer 100 further includes multi-phase divider circuitry 102. Multi-phase divider circuitry 102 is any circuitry including hardware and/or software configured to receive a multi-phase clock vector 108 and select a selected clock signal from the plurality of clock signals comprising the multi-phase clock vector 108 such that a fractional frequency feedback signal 112 is generated with a frequency and phase offset substantially equivalent to the reference signal 106. FIG. 4 depicts a non-limiting example of multi-phase divider circuitry 102 in accordance with the present disclosure.

Referring now to FIG. 4, example multi-phase divider circuitry 402 is provided. As depicted in FIG. 4, the example multi-phase divider circuitry 402 includes an accumulator 440 configured to receive a fractional clock 439 and a step value 446 and generate a count value 447. The count value 447 is monitored by rollover detector circuitry 442 configured to detect a rollover event and generate a rollover value 437. As further depicted in FIG. 4, phase computation circuitry 443 is configured to receive the rollover value 437 and determine a clock selection signal 450 corresponding to a clock signal in the multi-phase clock vector 408. The clock selection circuitry 444 is configured to select the clock signal from the multi-phase clock vector 408 according to the clock selection signal 450 and transmit the selected clock signal 449 to the clock output circuitry 445. As further depicted in FIG. 4, the clock output circuitry 445 is configured to receive a counter oscillation signal 448 from comparator circuitry 441 based on the count value 447. The clock output circuitry 445 generates the fractional frequency feedback signal 412 based on the counter oscillation signal 448 and the selected clock signal 449.

As depicted in FIG. 4, the example multi-phase divider circuitry 402 includes an accumulator 440. An accumulator 440 is any circuitry including hardware and/or software configured to increment a count value 447 by a step value 446 in accordance with an oscillating signal (e.g., fractional clock 439). The accumulator is configured to generate the count value 447 represented by a counter bit quantity number of bits (e.g., 5 bits, 7 bits, 16 bits, etc.). For example, a count value 447 may comprise five bits. In such an instance, the count value 447 may represent values from 0 (5'b00000) to 31 (5'b11111).

The accumulator 440 is further configured to increment the count value 447 in accordance with an oscillating signal. An oscillating signal is any signal configured to oscillate between high and low logical values, such as a clock. Thus, the count value 447 may be incremented in conjunction with an edge (e.g., rising edge, falling edge) of the oscillating signal. For example, the count value 447 may increment by one every time a rising edge of the oscillating signal is detected. In some embodiments, the oscillating signal may comprise a fractional clock 439 corresponding with a clock oscillating at a fractional frequency in relation to a reference clock (e.g., reference signal 106).

The accumulator 440 is further configured to increment the count value 447 according to a step value 446. The step value 446 determines the amount by which the count value 447 is incremented. For example, in an instance in which the step value is 3, the count value 447 may progress from 0 to 3, 6, 9, 12, and so on, in coordination with the oscillating signal.

As further depicted in FIG. 4, the example multi-phase divider circuitry 402 includes comparator circuitry 441. Comparator circuitry 441 is any circuitry including hardware and/or software configured to receive a count value 447, compare the count value 447 to a fixed counter comparison value, and assert the counter oscillation signal 448 in an instance in which the count value 447 exceeds the fixed counter value. In some embodiments, the fixed counter comparison value may equal $2^{n-1}$, where n is the number of bits comprising the count value. In such an instance, the comparator circuitry 441 is configured to essentially output the most-significant bit of the counter. Thus, the counter oscillation signal is a logical 0 during the first half of the counter cycle and a logical 1 during the second half of the counter cycle. The counter oscillation signal 448 determines the logic value of the fractional frequency feedback signal 412 as generated by the clock output circuitry 445 in coordination with the selected clock signal 449.

The frequency of oscillation of the counter oscillation signal 448 is determined based at least in part on the predetermined step value 446, the counter bit quantity representing the number of bits comprising the count value 447, and the frequency of the fractional clock 439. For example, in some embodiments, the frequency of the counter oscillation signal 448 may be determined by:

$$F_{CO} = \left(\frac{\text{step value}}{2^N}\right) * F_{FC}$$

where $F_{CO}$ is the frequency of the counter oscillation signal 448, step value is the step value 446, N is the number of bits comprising the count value 447, and $F_{FC}$ is the frequency of the fractional clock 439.

As further depicted in FIG. 4, the example multi-phase divider circuitry 402 includes rollover detector circuitry 442. Rollover detector circuitry 442 is any circuitry including hardware and/or software configured to detect a rollover event of a counter (e.g., count value 447) and determine a rollover value 437 associated with a rollover event. In an instance in which the count value 447 is incremented during operation, the count value 447 may eventually exceed the maximum number representable by the number of bits comprising the count value. In such an instance, the count value 447, experiences a rollover event, meaning the count returns to or passes over zero and begins incrementing from zero. For example, a count value 447 comprising five bits may represent the value 0 (5'b00000) to 31 (5'b11111). When the count value 447 is 31, an increment of the count value 447 by 1 returns the count value to 0. Similarly, in an instance in which the count value 447 is incremented by a step value 446, any instance in which adding the step value 446 to the count value 447 causes the step value 446 to exceed the maximum value representable by the bits comprising the count value 447 initiates a rollover event. Such an event may be detected by the rollover detector circuitry 442.

In addition to detecting the rollover event, the rollover detector circuitry 442 may also determine a rollover value 437. A rollover value 437 is the value by which the count value 447 exceeds the maximum value representable by the bits of the count value 447. For example, in an instance in which the count value 447 is 30, the maximum value representable by the bits of the count value 447 is 31, and the step value 446 is 5, the rollover value 437 is 4. The resulting increment would result in a count value 447 of 35, however, since the count value 447 may only represent numbers up to 31, four is left over and the rollover value 437 is thus equal to four.

As further depicted in FIG. 4, the example multi-phase divider circuitry 402 includes phase computation circuitry 443. The phase computation circuitry 443 is any circuitry including hardware and/or software configured to receive the rollover value 437 and provide a clock selection signal 450 to the clock selection circuitry 444 specifying the clock signal from the multi-phase clock vector 408 most accurately aligning with an ideal signal oscillating at the desired fractional frequency.

As described herein, the rollover detector circuitry 442 is configured to detect a rollover event associated with a count value 447 based on the previous count value 447 and the step value 446. The rollover value 437 is used to determine the clock signal from the multi-phase clock vector 408 that may be selected to compensate for the magnitude of the rollover value 437. As described in relation to FIG. 1, in some embodiments, the multi-phase clock vector 408 comprises a plurality of clock signals equally spaced in phase offset ($\varphi_n$) across a period of a first clock in the multi-phase clock vector 408. Clock signals equally spaced across the period of the first clock in the multi-phase clock vector 408 may be leveraged to select the clock signal in the sequence of clock signals most aligned with the rollover event of the count value 447 which corresponds with the ideal fractional frequency.

For example, in some embodiments, the phase computation circuitry 443 may determine the clock signal of the multi-phase clock vector 408 to select based on the equation:

$$\text{phase number} = \frac{\text{rollover value}}{\text{step value}} * \text{clock\_vector}_{size}$$

where phase number is the number of the phase to be selected, rollover value is the rollover value 437 determined by the rollover detector circuitry 442, step value is the step value 446 by which the count value 447 is incremented, and clock_vector$_{size}$ is the size of the multi-phase clock vector 408. In some embodiments, the phase number is assigned to the clock signals in descending order, for example, the first clock signal is assigned the phase number clock_vector$_{size}$−1, the clock signal shifted by phase offset on is assigned clock_vector$_{size}$−2, the clock signal shifted by phase offset 2*$\varphi_n$ is assigned clock_vector$_{size}$−3, and so on. Thus, in an instance in which the rollover value is 5, the step value is 7, and the clock_vector$_{size}$ is 4, the phase number may be calculated as:

$$\text{phase number} = \frac{5}{7} * 4 = 2.86$$

In such an instance, the phase number may be rounded to the nearest clock signal phase and the clock signal assigned phase number 3 (e.g., the second phase in the multi-phase clock vector sequence) may be selected.

By selecting the phase number exhibiting an oscillating event (e.g., a rising clock edge) most aligned with the ideal oscillating event, the amount of jitter in the fractional frequency signal (e.g., fractional frequency signal 110) may be reduced. Specifically, the peak-to-peak value and the RMS value of the jitter signal may be reduced.

As further depicted in FIG. 4, the example multi-phase divider circuitry 402 includes clock selection circuitry 444. The clock selection circuitry 444 is any circuitry including hardware and/or software configured to transmit a selected clock signal 449 from a multi-phase clock vector 408 based on a clock selection signal 450. In some embodiments, the clock selection circuitry 444 may comprise a multiplexer, configured to select the selected clock signal 449 from the multi-phase clock vector 408 based on the clock selection signal 450.

As further depicted in FIG. 4, the example multi-phase divider circuitry 402 includes clock output circuitry 445. The clock output circuitry 445 is any circuitry including hardware and/or software configured to generate a fractional frequency feedback signal 412 based on the value of the counter oscillation signal 448 and timed in accordance with the selected clock signal 449. For example, the fractional frequency feedback signal 412 may be configured to update in coordination with the selected clock signal 449 to the value provided by the counter oscillation signal 448. In some embodiments, the clock output circuitry 445 may comprise a flip-flop, latch, or other similar circuit element.

As depicted in FIG. 4, the example multi-phase divider circuitry 402 generates a fractional frequency feedback signal 412 based on the fractional clock 439. In some embodiments, the fractional frequency feedback signal 412 exhibits a fractional frequency when compared with the frequency of the fractional clock 439, in other words, $F_{412}/F_{439}$ is not an integer. Thus, the fractional frequency feedback signal 412 may be configured as part of a feedback loop to align with a reference signal (e.g., reference signal 106), while the fractional clock 439 exhibits a non-integer frequency relative to the reference signal.

Returning to FIG. 1, the example fractional frequency synthesizer 100 further includes compare circuitry 114. Compare circuitry 114 is any circuitry including hardware and/or software configured to receive two input signals (e.g., fractional frequency feedback signal 112, reference signal 106) and generate a difference signal 116 based on a difference in the frequency and/or phase offset of the two input signals. When utilized as the input voltage to a multi-phase clock generator 104, the difference signal 116 causes the multi-phase clock generator 104 to produce a fractional frequency signal 110 such that the fractional frequency feedback signal 112 converges in frequency and phase offset with the reference signal 106.

Figure 5:
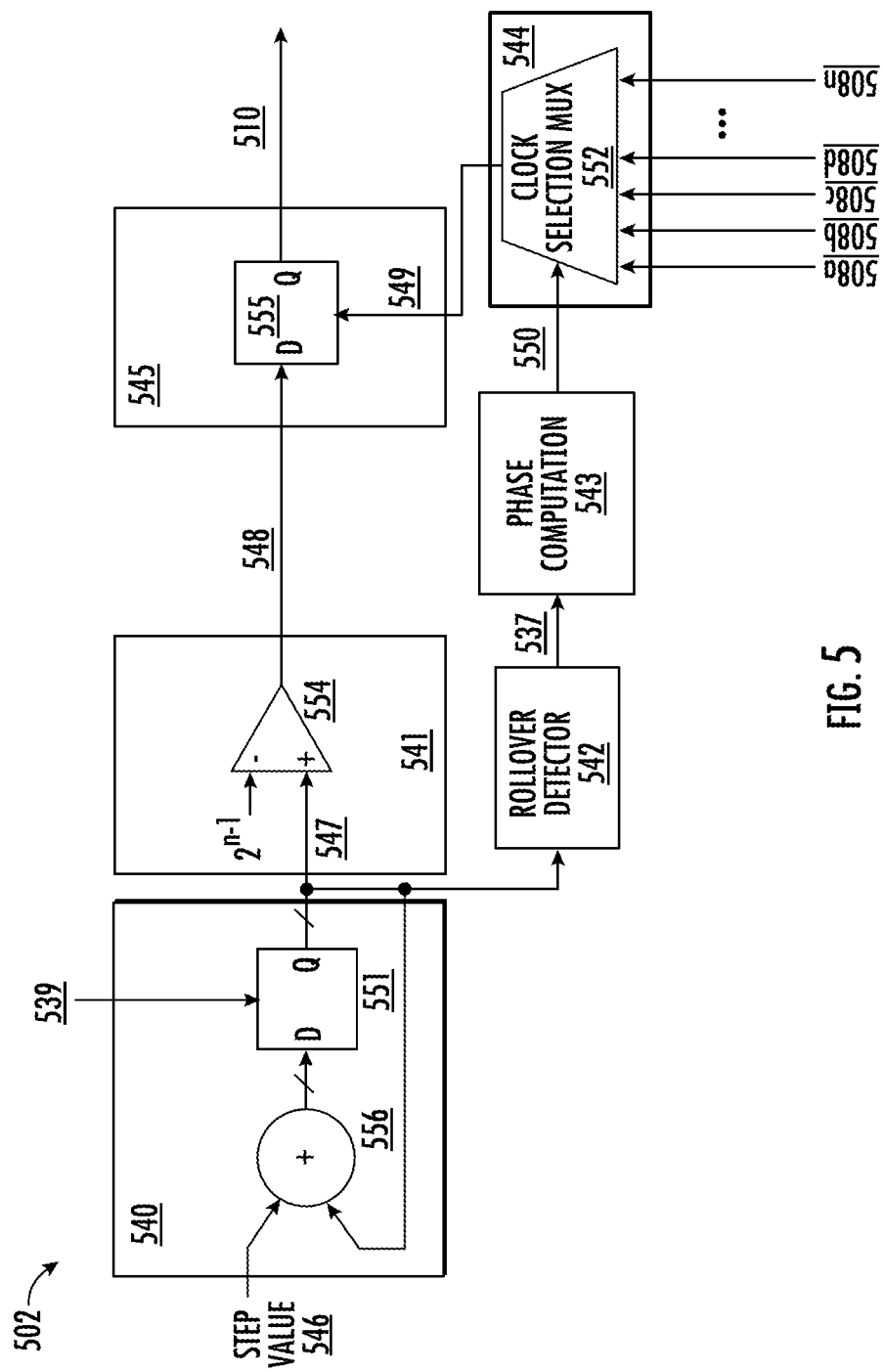
FIG. 5 illustrates an example circuit-level diagram of an example embodiment of a multi-phase divider block in accordance with an example embodiment of the present disclosure.

Referring now to FIG. 5, an example embodiment of multi-phase divider circuitry 502 is provided. As depicted in FIG. 5, the example embodiment of multi-phase divider circuitry 502 includes an accumulator 540 generating a count value 547 based on a step value 546 and a fractional clock 539. The multi-phase divider circuitry 502 further includes a comparator 541 configured to generate a counter oscillation signal 548 based on the count value 547. Rollover detector circuitry 542 is also included, configured to receive the count value 547 and generate a rollover value 537. The rollover value 537 is received by phase computation circuitry 543 configured to transmit a clock selection signal 550 to a clock selection mux 552. The clock selection circuitry 544 transmits a selected clock signal 549 from the multi-phase clock vector 508 comprising clock signals 508a-508n to the clock output circuitry 545. The clock output circuitry 545 generates a fractional frequency feedback signal 512 based at least in part on the counter oscillation signal 548 and the selected clock signal 549.

As further depicted in FIG. 5, the accumulator 540 includes an adder 556 and a flip-flop 551. The adder 556 increments the count value 547 by the step value 546. The flip-flop 551 causes the increment in the count value 547 to coincide with the oscillation of the fractional clock 539. For example, in some embodiments, the count value 547 is incremented by step value 546 with every rising clock edge of the fractional clock 539.

As further depicted in FIG. 5, the comparator 541 comprises an op-amp comparator 554. The op-amp comparator 554 compares the count value 547 to a fixed counter comparison value (e.g., $2^{n-1}$ where n is the number of bits comprising count value 547) and generates a counter oscillation signal 548 based on the comparison. For example, by comparing to the value $2^{n-1}$, the counter oscillation signal 548 essentially represents the most significant bit of the count value 547. Thus, the counter oscillation signal 548 is a logical 1 for the first half of count value 547 and a logical 0 for the second half of count value 547.

As further depicted in FIG. 5, the clock selection circuitry 544 of the example multi-phase divider circuitry 502 includes a clock selection mux 552. The clock selection mux 552 receives the clock selection signal 550 from the phase computation circuitry 543 and transmits the clock signal 508a-508n corresponding to the clock selection signal 550 as the selected clock signal 549 to the clock output circuitry 545.

As further depicted in FIG. 5, the clock output circuitry 545 includes a flip-flop 555. By utilizing the selected clock signal 549 as the clock to the flip-flop 555, the value of the counter oscillation signal 548 is output as the fractional frequency feedback signal 512 in synchronization with the selected clock signal 549.

By selecting the selected clock signal 549 exhibiting an oscillating event (e.g., a rising or falling clock edge) most aligned with the ideal oscillating event, the amount of jitter in the fractional frequency signal (e.g., fractional frequency signal 110) may be reduced. Specifically, the peak-to-peak value and the RMS value of the jitter signal may be reduced.

Figure 6:
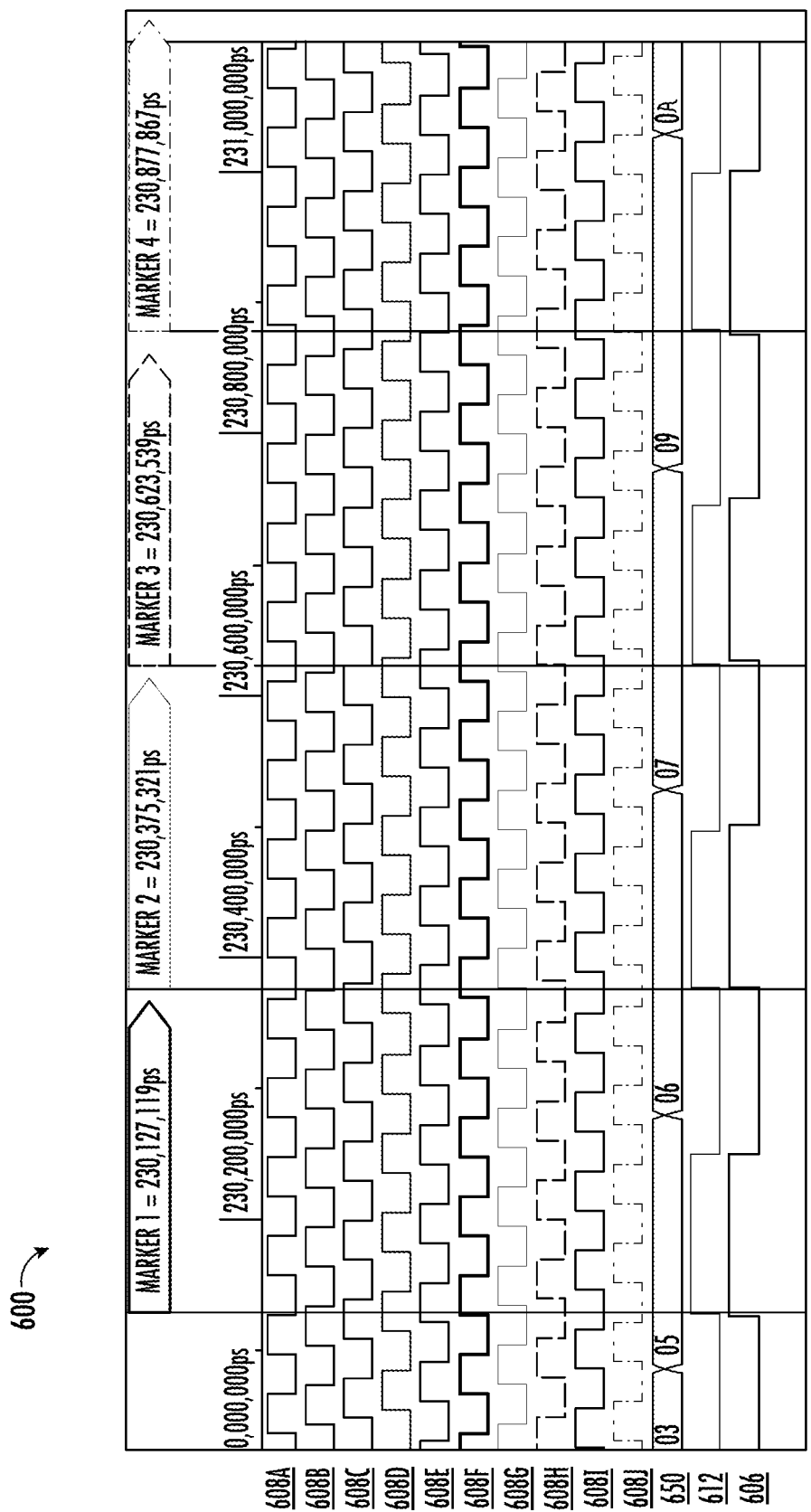
FIG. 6 illustrates an example signal diagram depicting a selected clock signal in accordance with an example embodiment of the present disclosure.

Referring now to FIG. 6, an example signal diagram 600 is provided. The example signal diagram 600 depicts a plurality of clock signals 608a-608j comprising a multi-phase clock vector 608. As depicted in FIG. 6, each of the plurality of clock signals is equally offset over a period of the first clock signal (e.g., clock signal 608a). Thus, since the multi-phase clock vector 608 comprises ten clock signals 608a-608j, each clock signal is offset one-tenth of the clock period, or π/5 from the previous clock signal 608a-608j.

As further depicted in FIG. 6, a clock selection signal 650 may be determined by phase computation circuitry (e.g., phase computation circuitry 443, 543) in order to select a clock signal 608a-608j most closely aligned with the reference signal 606. In some embodiments, the phases of the clock signals 608a-608j may be assigned a phase number. For example, 608a may be assigned phase number 0, 608b may be assigned phase number 1, 608c may be assigned phase number 2, 608d may be assigned phase number 3, and so on until 608j is assigned phase number 9. In such an embodiment, the clock selection signal 650 (e.g., clock selection signal 450, 550) corresponds to a phase offset within the multi-phase clock vector 608.

As further depicted in FIG. 6, the selected clock signal 608a-608j based on the clock selection signal 650 periodically changes to align with the reference signal 606. By utilizing a multi-phase clock vector 608 and selecting the phase of the multi-phase clock vector 608 most closely aligning with the ideal clock edge, a fractional frequency signal may be generated with minimal jitter.

Figure 7:
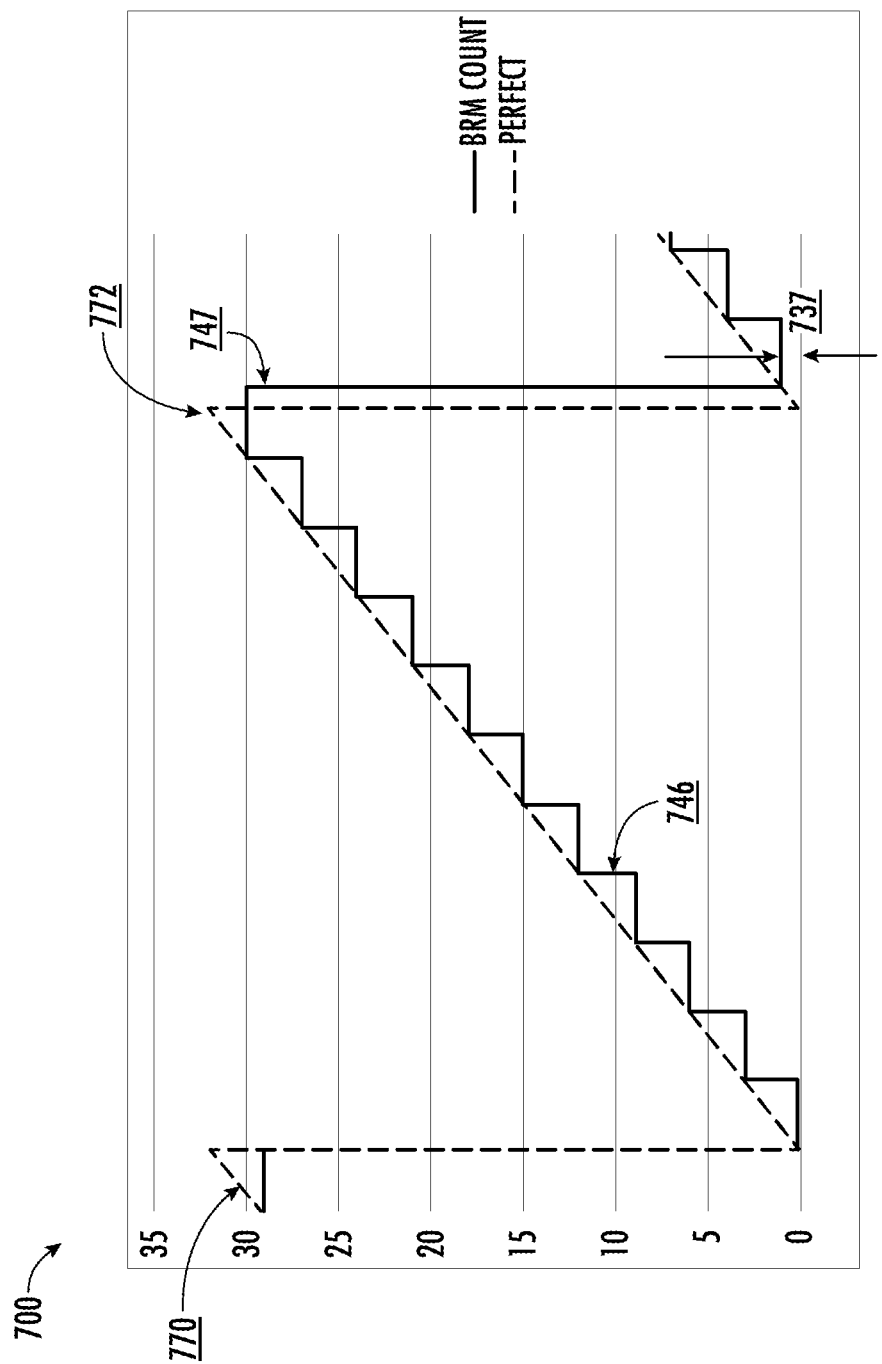
FIG. 7 illustrates an example accumulator count compared to an example ideal count in accordance with an example embodiment of the present disclosure.

Referring now to FIG. 7, an example accumulator count 700 is depicted. As depicted in FIG. 7, the reference count 770 depicts an ideal count. An ideal count is the count value to be followed in order to obtain a desired fraction frequency. Depending on the size of the step value 746, the rollover of the count value 747 may not align with the rollover point 772 of the reference count 770. For example, as depicted in FIG. 7, in an instance in which the count value 747 is incremented by step value 746, the count value 747 increments passed the rollover point 772 by a certain rollover value 737. By detecting the rollover of the count value 747 and determining the rollover value 737, a clock signal of a multi-phase clock vector may be selected to align with the rollover point 772.

Figures 8A, 8B:
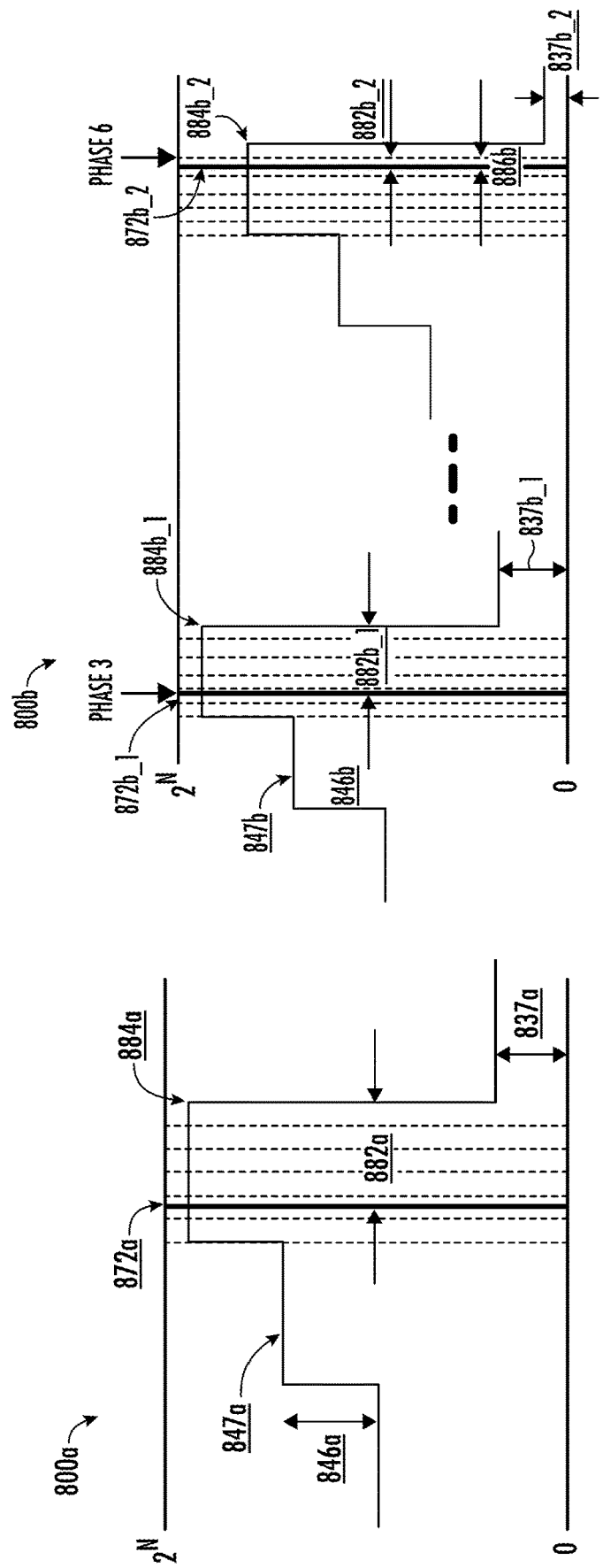
FIG. 8A-FIG. 8B illustrate example accumulator rollover events in accordance with an example embodiment of the present disclosure.

Referring now to FIG. 8A, an example phase selection diagram 800a is provided. As depicted in FIG. 8A, a count value 847a is incremented by a step value 846a. The count value 847a is configured to rollover at a value $2^N$ where N is the number of bits comprising the count value 847a. The trigger rollover point 872a represents the precise time at which the fractional frequency feedback signal should be asserted to generate the fractional frequency feedback signal with the desired frequency. However, due to the step value 846a, the trigger rollover point 872a may not align precisely with an increment of the count value 847a. Instead, the detected rollover event 884a is not detected until the next increment of the count value 847a by step value 846a. The detected rollover event 884a occurs at a delay 882a after the trigger rollover point 872a. The delay 882a represents the elapsed time after the trigger rollover point 872a that the detected rollover event 884a occurs.

The delay 882a may be inferred by the rollover value 837a. The rollover value 837a represents the count value 847a after the count value 847a has rolled over. Thus, the rollover value 837a also represents the passage of time after the trigger rollover point 872a that the detected rollover event 884a occurs. In some embodiments, the detected rollover event 884a may be detected before incrementing the count value 847a. In addition, the phase of the multi-phase clock vector in closest proximity to the trigger rollover point 872a may be determined. For example, as described in relation to FIG. 4, the phase number of the clock signal in closest proximity to the trigger rollover point 872a may be detected by the equation:

$$\text{phase number} = \frac{\text{rollover value}}{\text{step value}} * \text{clock\_vector}_{size}$$

where rollover value is the rollover value 837*a*, step value is the step value 846*a*, and clock_vector$_{size}$ is the size of the multi-phase clock vector.

By detecting the detected rollover event 884*a* previous to incrementing the count value 847*a* and determining the phase number of the clock signal in closest proximity to the trigger rollover point 872*a*, the oscillation event of the generated reference signal may more accurately coincide with the trigger rollover point 872*a*.

By selecting the selected clock signal most accurately aligned with the trigger rollover point 872*a*, the amount of jitter in the fractional frequency signal (e.g., fractional frequency signal 110) may be reduced. Specifically, the peak-to-peak value and the RMS value of the jitter signal may be reduced.

Referring now to FIG. 8B, an example phase selection diagram 800*b* comprising multiple sequential trigger rollover points 872*b*_1, 872*b*_2 is provided. As depicted in FIG. 8B, a count value 847*b* is incremented by a step value 846*b*. The count value 847*b* is configured to rollover at a value $2^N$ where N is the number of bits comprising the count value 847*a*.

As depicted in FIG. 8B, the detected rollover event 884*b*_1 is detected and the rollover value 837*b*_1 determined. Based on the determined rollover value 837*b*_1, the clock signal of the multi-phase clock vector with phase number three is selected. The clock signal with phase number three, in the example depicted in FIG. 8B experiences a clock signal event in closest proximity to the trigger rollover point 872*b*_1. By determining the phase number of the clock signal in closest proximity to the trigger rollover point 872*b*_1, the clock signal is selected such that the selected clock signal exhibits a clock signal event in closest proximity to the desired oscillation event of the generated reference signal.

Similarly, a later detected rollover event 884*b*_2 is detected and the rollover value 837*b*_2 determined. Based on the determined rollover value 837*b*_2, the clock signal of the multi-phase clock vector with phase number six is selected, since the clock signal with phase number six, experiences a clock signal event in closest proximity to the trigger rollover point 872*b*_2, thus generating a reference signal having the desired oscillation frequency.

In some embodiments, the fractional clock (e.g., fractional clock 439, 539) may remain static during operation. For example, the fractional clock may remain the first clock signal in the multi-phase clock vector. In such an embodiment, subsequent clock selection determinations may determine the phase number of the selected clock in an absolute determination. For example, by determining the static phase number of the clock with an oscillation event in closest proximity to the trigger rollover point. In some embodiments, the fractional clock may be updated to match the phase of the selected clock. In such an embodiment, the phase number may be determined as an offset of the currently selected phase number. For example, in an instance in which the clock signal associated with static phase number 5 is selected, and the fractional clock is updated to the clock signal associated with static phase number 5, the phase number determination may indicate the phase number relative to static phase number 5. For example, a calculation resulting in a phase number of 3 may indicate to select the clock signal associated with a phase number 3 less than the current phase number (e.g., 5). Thus, the clock signal associated with phase number 2 may be selected.

As further depicted in FIG. 8A, a quantification error 886*b* may exist. The quantification error 886*b* represents the offset in the phase of the selected clock signal (e.g., phase 6) and the trigger rollover point (e.g., trigger rollover point 872*b*_2). As described herein, the calculation of the phase number associated with the clock signal having an oscillation point in closest proximity to the trigger rollover point may result in a decimal number. However, only an integer phase number may be selected. Thus, various rounding techniques may be employed to select the phase number. The difference between the selected phase number and the trigger rollover point is the quantification error 886*b*. In some instances, the quantification error 886*b* may accumulate during operation. Such accumulation of the quantification error 886*b* may result in a shift of the output edge of the generated fractional frequency feedback signal. To avoid such an error, in some embodiments, the quantification error 886*b* may be accumulated and stored. The accumulated quantification error 886*b* may be used in the determination of the phase number of the reference clock.

Figure 9:
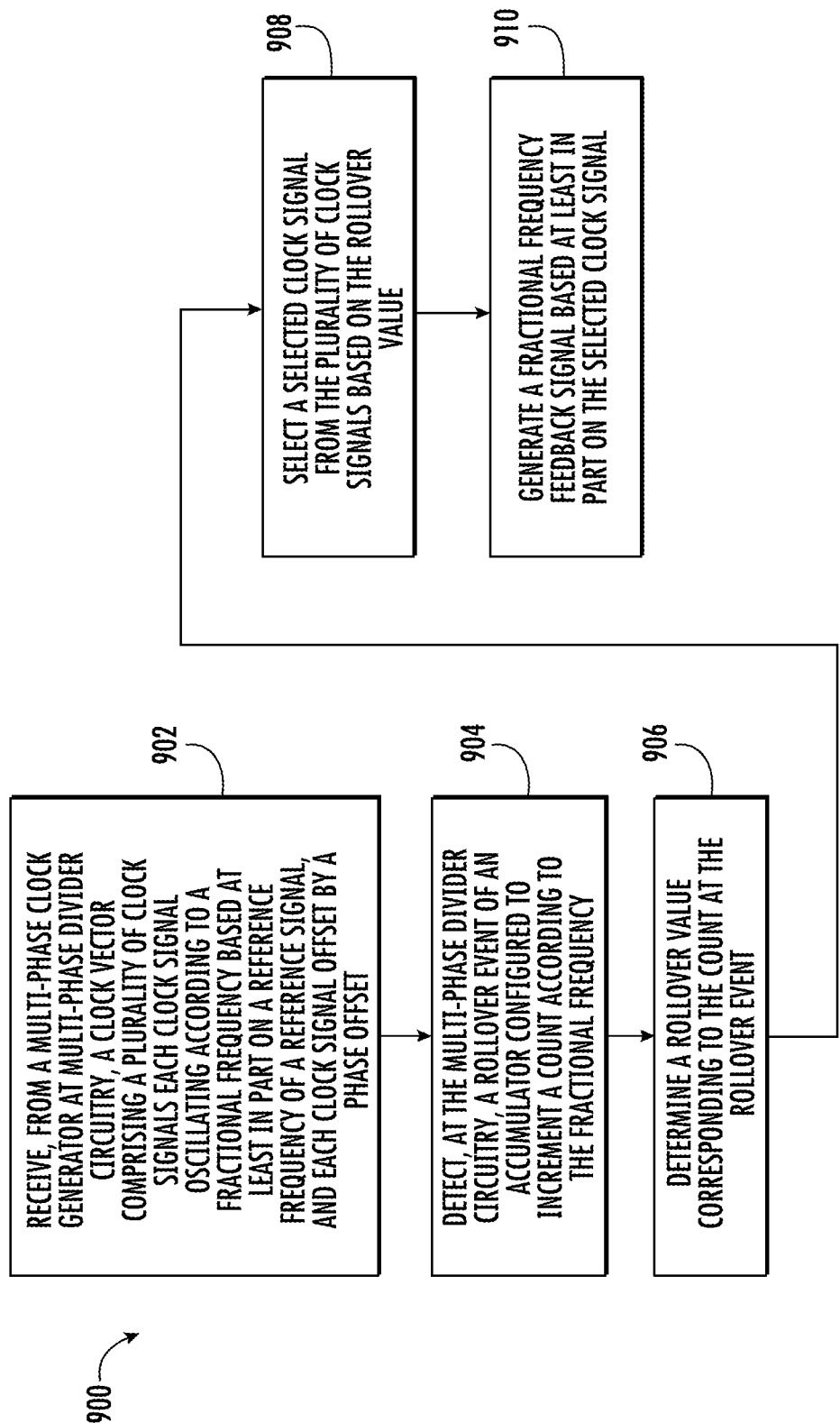
FIG. 9 depicts an example flow chart illustrating an example method for determining a fractional frequency signal based on a reference signal in accordance with an example embodiment of the present disclosure.

Referring now to FIG. 9, an example flow diagram illustrating a process 900 for generating a fractional frequency feedback signal (e.g., fractional frequency feedback signal 112, 412, 512) is provided. At block 902, a fractional frequency synthesizer (e.g., fractional frequency synthesizer 100) receives, from a multi-phase clock generator (e.g., multi-phase clock generator 104) at multi-phase divider circuitry (e.g., multi-phase divider circuitry 102, 402, 502) a clock vector (e.g., multi-phase clock vector 108, 208, 308, 408, 508, 608) comprising a plurality of clock signals each clock signal oscillating according to a fractional frequency based at least in part on a reference frequency of a reference signal, and each clock signal offset by a phase offset. As described herein, a multi-phase clock generator may generate a plurality of clocks, each oscillating at an oscillating frequency and offset by a phase offset. In some embodiments, the plurality of clocks may be equally offset from the first clock in the plurality of clocks across the period of the first clock. For example, in an instance in which the clock vector comprises ten clocks, the second clock may be offset from the first clock by $\pi/5$, the third clock may be offset from the first clock by $2\pi/5$, the third clock may be offset from the first clock by $3\pi/5$, and so on.

At block 904, the fractional frequency synthesizer detects, at the multi-phase divider circuitry, a rollover event (e.g., detected rollover event 884*a*) of an accumulator (e.g., accumulator 440, 540) configured to increment a count (e.g., count value 447, 547, 747, 847*a*, 847*b*) according to the fractional frequency. As described herein, the multi-phase divider circuitry may comprise an accumulator. The accumulator may be configured to increment a count value in accordance with a fractional frequency. The count value of the accumulator may be configured with a counter bit quantity number of bits and may further be configured to increment according to a step value. The count value may be incremented by the step value, and each time the count value rolls over, the rising edge of the generated fractional frequency feedback signal may be asserted. The step value and the counter bit quantity thus determine the frequency with which the counter rolls over and the frequency of the fractional frequency signal (e.g., fractional frequency signal 110) and the fractional frequency feedback signal.

At block 906, the fractional frequency synthesizer determines a rollover value (e.g., rollover value 737, 837*a*, 837*b*) corresponding to the count at the rollover event. The rollover value is equal to the count value at the time of the rollover event corresponding to the accumulator count value. From the rollover value, the delay of the rollover event from the ideal trigger rollover point may be inferred.

At block 908, the fractional frequency synthesizer selects a selected clock signal (e.g., selected clock signal 449, 549) from the plurality of clock signals based on the rollover value. As described herein, the phase number associated with the selected clock signal may be determined based on the ratio of the rollover value to the step value, and further based on the number of clock signals in the multi-phase clock vector. In some embodiments, the determined phase number may represent the absolute phase number of the clock signal in the plurality of clock signals. In some embodiments, the phase number may represent an offset from the fractional clock operating the accumulator count. In addition, in some embodiments, a quantification error based on rounding to the nearest phase number may be accumulated and stored. The accumulated quantification error may be used to adjust the clock selection in subsequent rollover events.

By selecting the selected clock signal most accurately aligned with the trigger rollover point, the amount of jitter in the fractional frequency signal (e.g., fractional frequency signal 110) may be reduced. Specifically, the peak-to-peak value and the RMS value of the jitter signal may be reduced.

At block 910, the fractional frequency synthesizer generates a fractional frequency feedback signal based at least in part on the selected clock signal. As described herein, the fractional frequency feedback signal may be generated to align with an input reference signal having a reference frequency. Aligning the fractional frequency feedback signal with the reference signal enables the generation of a fractional frequency signal exhibiting a non-integer frequency relative to the reference frequency.

Figure 10:
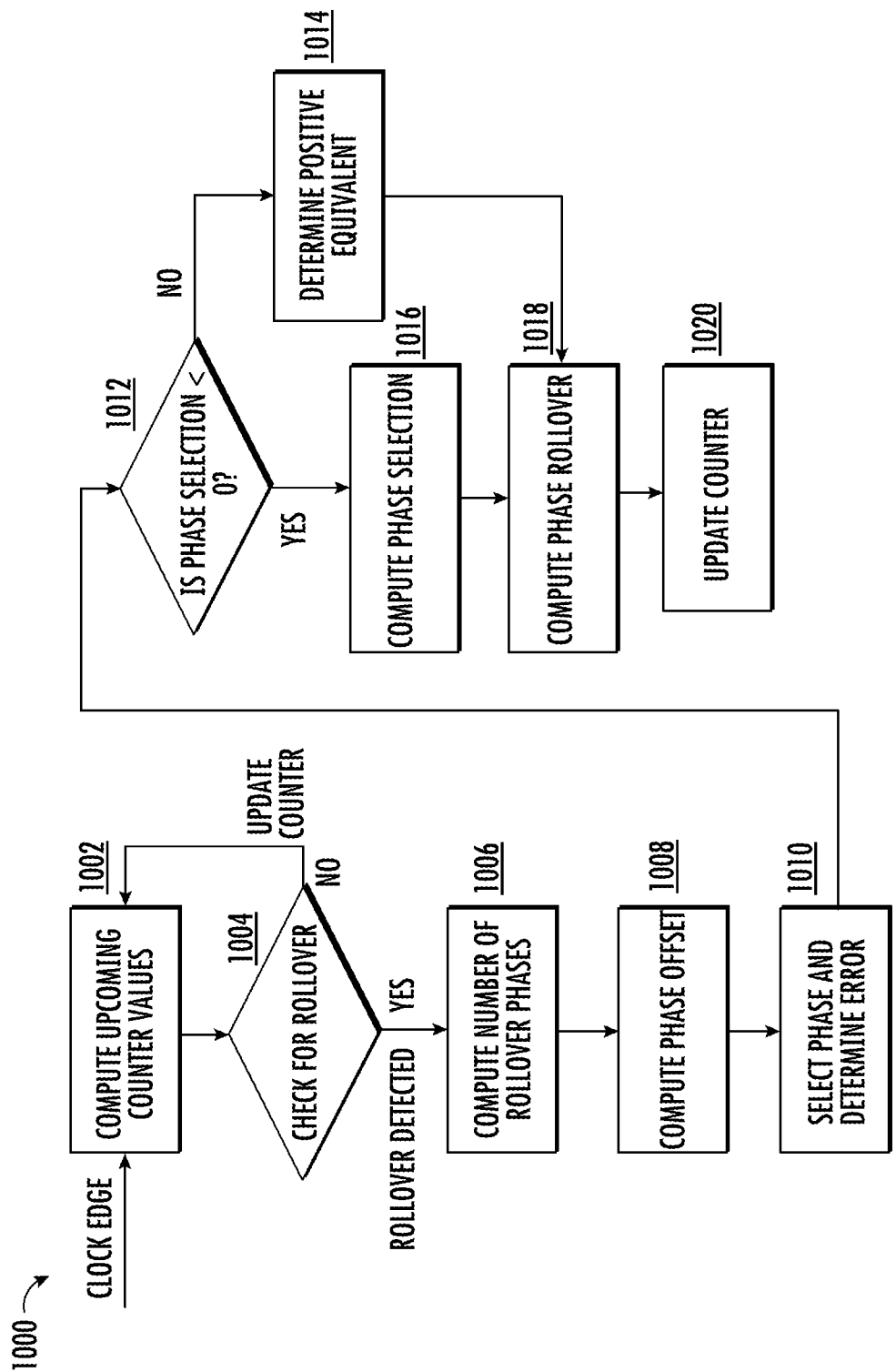
FIG. 10 illustrates an example embodiment of a method for determining a fractional frequency signal based on a reference signal in accordance with an example embodiment of the present disclosure.

Referring now to FIG. 10, an example flow diagram illustrating a process 1000 for generating a fractional frequency signal exhibiting a non-integer frequency relative to a reference frequency at a fractional frequency synthesizer is provided. At block 1002, a clock edge of a fractional clock is received at an accumulator storing a count value that is incremented by a step value at the clock edge. The clock edge may correspond to the rising clock edge, the falling clock edge, or both. In some embodiments, the fractional clock may correspond to the first clock signal in the plurality of clock signals oscillating according to a fractional frequency. In some embodiments, the fractional clock may correspond to a selected clock signal from the plurality of clock signals oscillating according to the fractional frequency.

At the clock edge, one or more upcoming counter values are computed by adding the step value to the current count value. In some embodiments, two or more step values may be added to the current count value to determine upcoming count values. For example, the next count value may be determined by adding the step value to the current count value. The second next count value may be determined by adding the step value to the next count value.

At block 1004, the fractional frequency synthesizer checks for an upcoming rollover event of the count value. A rollover event may be determined by comparing the next count value and/or the second next count value to the maximum count value (e.g., $2^N$, where N is the number of bits in the count value). In an instance in which rollover is detected, the process 1000 continues at block 1006. In an instance in which rollover is not detected, the process 1000 returns to block 1002 to await the next clock edge.

At block 1006, the fractional frequency synthesizer computes the rollover value and the number of rollover phases. The rollover value may be computed by the equation:

rollover value=next count value(mod $2^N$)

where N is the number of bits in the count value. The number of phases may be computed by the equation:

$$\text{phase number} = \frac{\text{rollover value}}{\text{step value}} * \text{clock\_vector}_{size}$$

where step value is the step value provided to the accumulator and clock_vector$_{size}$ is the size of the multi-phase clock vector.

At block 1008, the fractional frequency synthesizer may need to compute a phase offset to the phase number based on the clock utilized to operate the accumulator. In an instance in which the clock provided to the accumulator is static, such as the first clock in the multi-phase clock vector, no adjustment is necessary. However, in an instance in which the clock is updated based on the selected clock signal, the phase number may be adjusted as an offset to the phase number of the selected clock signal.

At block 1010, the fractional frequency synthesizer selects a phase number and determines the quantification error associated with the phase number. As described herein, in some embodiments, the phase number as determined in block 1006/1008 may correspond with a non-integer value. However, an integer value must be determined when selecting a phase number. In some instances, the selected phase may be determined by rounding up, rounding down, truncating, or other similar operation. The quantification error is any error introduced by selecting an integer phase number. For example, in an instance in which the ideal trigger rollover point is determined to be 2.7 phases before the next clock event, the clock signal 3 phases before the next clock event may be selected by rounding up 2.7 to 3. In such an instance, the quantification error is 0.3, representing the difference between the selected clock phase and the calculated clock phase. In some embodiments, the quantification error may be stored and/or accumulated to be used in the selection of a future clock phase.

At block 1012, the fractional frequency synthesizer determines if the phase number selected in block 1010 is a negative number. In some instances, especially in an instance in which a phase offset is determined based on a previous rollover value, a negative number may result as the determined phase number. In such an instance, the process 1000 continues at step 1014 where the positive equivalent is determined. Because the phases are equally spaced across a period, a negative phase number simply corresponds to a different phase number on a previous or later clock cycle. For example, a phase number of −1 may correspond to phase number 8 (in an instance in which there are 8 clock signals) during the next clock period. The phase number may be adjusted to account for such situations.

If the phase number selected in block 1010 is positive, the phase number is unaltered at block 1016.

At block 1018, any phase offset to be considered in the next count rollover is determined and stored.

At block 1020, the count value is updated based on the overflow and the selected clock. For example, in some embodiments, the count value may be set to 0 in an instance in which a new phase clock was selected.

Figure 11:
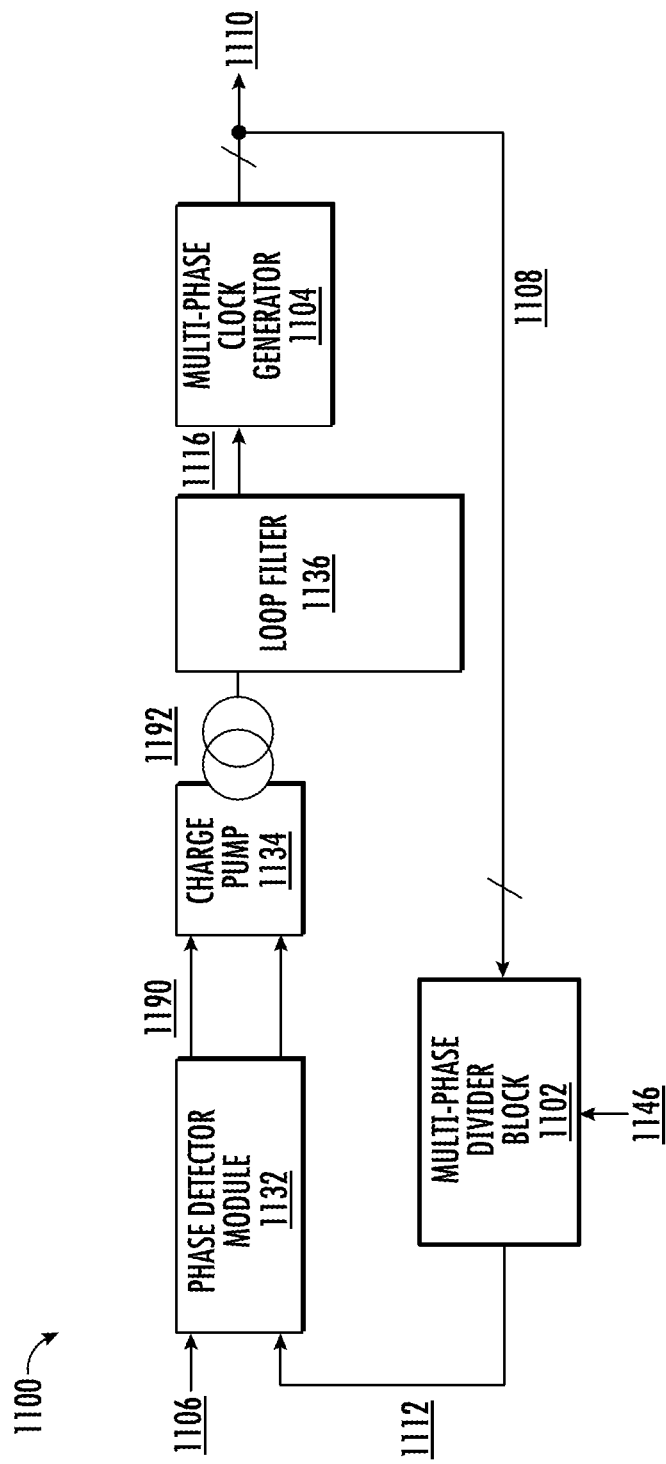
FIG. 11 illustrates an example block diagram of a fractional PLL including a fractional frequency synthesizer in accordance with an example embodiment of the present disclosure.

Referring now to FIG. 11, an example fractional phase-locked loop (PLL) comprising a fractional frequency synthesizer is provided. As depicted in FIG. 11, the example fractional PLL includes multi-phase divider circuitry 1102. The multi-phase divider circuitry 1102 receives a multi-phase clock vector 1108 and selects a clock signal from the plurality of clock signals comprising the multi-phase clock vector 1108 to generate a fractional frequency feedback signal 1112 substantially matching the frequency and phase of the reference signal 1106.

As further depicted in FIG. 11, the fractional frequency feedback signal 1112 and the reference signal 1106 are compared at a phase detector module 1132. The phase detector module 1132 is any circuitry including hardware and/or software configured to receive two input signals (e.g., the fractional frequency feedback signal 1112 and the reference signal 1106) and output a phase difference signal 1190 representing the difference in phase and or frequency of the two input signals.

The example fractional PLL 1100 further includes charge pump circuitry 1134. The charge pump circuitry 1134 is any circuitry including hardware and/or software configured to convert the phase difference signal 1190 into a signal compatible with the multi-phase clock generator circuitry 1104. The charge pump circuitry 1134 may boost the voltage, convert the voltage, or perform any other operation necessary to convert the phase difference signal 1190.

The example fractional PLL 1100 further includes loop filter circuitry 1136. The loop filter circuitry 1136 is any circuitry comprising hardware and/or software configured to receive and filter the charge difference signal 1192 to generate a filtered difference signal 1116 (e.g., difference signal 116, 216) to be transmitted to the multi-phase clock generator circuitry 1104. The loop filter circuitry 1136 may remove high frequency noise or other similar filtering operations to generate the charge difference signal 1192.

As further depicted in FIG. 11, the example fractional PLL 1100 includes multi-phase clock generator circuitry 1104. As described herein, the multi-phase clock generator circuitry 1104 is configured to generate a multi-phase clock vector 1108 comprising a plurality of clock signals each offset from the first clock signal in the plurality of clock signals by a phase offset. Each of the clock signals comprising the multi-phase clock vector 1108 exhibits an oscillation frequency that may be a non-integer multiple of the reference frequency of the reference signal. The fractional frequency signal 1110 may be generated based at least in part on the multi-phase clock vector 1108.

While this detailed description has set forth some embodiments of the present invention, the appended claims cover other embodiments of the present invention which differ from the described embodiments according to various modifications and improvements. For example, one skilled in the art may recognize that such principles may be applied to any electronic device that utilizes a fractional phase-locked loop. For example, a radio frequency transmitter, a radio frequency receiver, frequency modulation/demodulation, frequency shift keying, signal conditioning, clock synchronization, frequency synthesis, and so on.

Within the appended claims, unless the specific term "means for" or "step for" is used within a given claim, it is not intended that the claim be interpreted under 35 U.S.C. 112, paragraph 6.

Use of broader terms such as "comprises," "includes," and "having" should be understood to provide support for narrower terms such as "consisting of," "consisting essentially of," and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

The invention claimed is:

1. A fractional frequency synthesizer, comprising:
 a multi-phase clock generator configured to generate a clock vector based on a reference signal having a reference frequency,
  wherein the clock vector comprises a plurality of clock signals each clock signal oscillating according to a fractional frequency in relation to the reference frequency, and wherein each clock signal is offset by a phase offset; and
 multi-phase divider circuitry electrically connected to the multi-phase clock generator and configured to receive the clock vector and select a selected clock signal from the plurality of clock signals to generate a fractional frequency feedback signal, the multi-phase divider circuitry comprising:
  an accumulator configured to increment a count according to the fractional frequency; and
  a rollover detector configured to determine a rollover value associated with a rollover event of the count on the accumulator;
  wherein the selected clock signal is selected based on the rollover value, and
  wherein the fractional frequency feedback signal is generated based at least in part on the selected clock signal.

2. The fractional frequency synthesizer of claim 1, wherein the multi-phase clock generator comprises a voltage-controlled ring oscillator.

3. The fractional frequency synthesizer of claim 2, wherein the voltage-controlled ring oscillator comprises:
 a delay line comprising a plurality of delay elements,
  wherein the plurality of clock signals comprising the clock vector are transmitted from a plurality of contact points along the delay line.

4. The fractional frequency synthesizer of claim 1, wherein the accumulator comprises:
 a counter comprising a counter bit quantity number of bits,
  wherein the counter is configured to increment the count by a step value.

5. The fractional frequency synthesizer of claim 4, wherein the fractional frequency of the plurality of clock signals is determined based at least in part on the counter bit quantity and the step value.

6. The fractional frequency synthesizer of claim 4, wherein the rollover value represents the count after the rollover event of the accumulator.

7. The fractional frequency synthesizer of claim 6, wherein the selected clock signal is determined based at least in part on a comparison of the rollover value to the step value.

8. The fractional frequency synthesizer of claim 7, wherein the comparison of the rollover value to the step value is determined using a division look-up table.

9. The fractional frequency synthesizer of claim 7, wherein a frequency offset is determined between a clock edge of the selected clock signal and an ideal clock edge of the fractional frequency feedback signal, and wherein a second selected clock signal corresponding with a next accumulator rollover event is determined based at least in part on the frequency offset.

10. The fractional frequency synthesizer of claim 1, wherein the selected clock signal is determined before the rollover event of the accumulator.

11. The fractional frequency synthesizer of claim 1, wherein the phase offset between each subsequent clock signal comprising the plurality of clock signals of the clock vector are equal.

12. The fractional frequency synthesizer of claim 1, wherein the clock vector comprises at least four clock signals.

13. A method for generating a fractional frequency feedback signal, comprising:
receiving, from a multi-phase clock generator at multi-phase divider circuitry, a clock vector comprising a plurality of clock signals each clock signal oscillating according to a fractional frequency based at least in part on a reference frequency of a reference signal, and each clock signal offset by a phase offset;
detecting, at the multi-phase divider circuitry, a rollover event of an accumulator configured to increment a count according to the fractional frequency;
determining a rollover value corresponding to the count at the rollover event;
selecting a selected clock signal from the plurality of clock signals based on the rollover value; and
generating the fractional frequency feedback signal based at least in part on the selected clock signal.

14. The method of claim 13, wherein the accumulator comprises:
a counter comprising a counter bit quantity number of bits,
wherein the counter is configured to increment the count by a step value based at least in part on the reference frequency.

15. The method of claim 14, wherein the fractional frequency of the plurality of clock signals is determined based at least in part on the counter bit quantity and the step value.

16. The method of claim 14, wherein the rollover value represents the count after the rollover event of the accumulator.

17. The method of claim 14, further comprising:
determining a relation between the rollover value and the step value; and
selecting the selected clock signal based at least in part on the relation.

18. The method of claim 13, further comprising:
determining a phase difference between a clock edge of the selected clock signal and an ideal clock edge of the reference signal; and
determining a second selected clock signal corresponding with a next accumulator rollover event based at least in part on the phase difference.

19. The method of claim 13, wherein the phase offset between each subsequent clock signal comprising the plurality of clock signals of the clock vector are equal.

20. A fractional phase-locked loop comprising:
a phase detector module configured to generate a difference signal corresponding to a difference between a phase of a reference signal and a fractional frequency feedback signal;
a loop filter configured to generate a filtered difference signal based at least in part on the difference signal; and
a fractional frequency synthesizer configured to generate the fractional frequency feedback signal, the fractional frequency synthesizer comprising:
a multi-phase clock generator configured to generate a clock vector based on the filtered difference signal, the clock vector comprising a plurality of clock signals each clock signal oscillating according to a fractional frequency based at least in part on a reference frequency of the reference signal, and each clock signal offset by a phase offset; and
multi-phase divider circuitry electrically connected to the multi-phase clock generator and configured to receive the clock vector and select a selected clock signal from the clock vector, to generate the fractional frequency feedback signal, the multi-phase divider circuitry comprising:
an accumulator configured to increment a count according to the fractional frequency; and
a rollover detector configured to detect a rollover value associated with a rollover event of the accumulator;
wherein the selected clock signal is selected based on the rollover value, and
wherein the fractional frequency feedback signal is generated based at least in part on the selected clock signal.

* * * * *